(12) United States Patent
Silberberg et al.

(10) Patent No.: US 10,711,339 B2
(45) Date of Patent: Jul. 14, 2020

(54) INDUSTRIAL VAPOR GENERATOR FOR DEPOSITING AN ALLOY COATING ON A METAL STRIP

(71) Applicants: Eric Silberberg, Gesves (BE); Luc VanHee, Oisey-le-Verger (FR); Bruno Schmitz, Nandrin (BE); Maxime Monnoyer, Liége (BE)

(72) Inventors: Eric Silberberg, Gesves (BE); Luc VanHee, Oisey-le-Verger (FR); Bruno Schmitz, Nandrin (BE); Maxime Monnoyer, Liége (BE)

(73) Assignee: Arcelormittal France, La Plaine Saint-Denis (FR)

( * ) Notice: Subject to any disclaimer, the term of this patent is extended or adjusted under 35 U.S.C. 154(b) by 0 days.

(21) Appl. No.: 16/198,388

(22) Filed: Nov. 21, 2018

(65) Prior Publication Data
US 2019/0093210 A1  Mar. 28, 2019

Related U.S. Application Data

(62) Division of application No. 13/140,061, filed as application No. PCT/EP2009/067448 on Dec. 17, 2009, now abandoned.

(30) Foreign Application Priority Data

Dec. 18, 2008 (EP) ..................... 08172179

(51) Int. Cl.
*C23C 14/24* (2006.01)
*C23C 14/16* (2006.01)
(Continued)

(52) U.S. Cl.
CPC ............ *C23C 14/243* (2013.01); *C23C 14/16* (2013.01); *C23C 14/24* (2013.01); *C23C 14/548* (2013.01);
(Continued)

(58) Field of Classification Search
CPC ....... C23C 14/24; C23C 14/243; C23C 14/16; C23C 14/548; C23C 14/562
See application file for complete search history.

(56) References Cited

U.S. PATENT DOCUMENTS 4,587,134 A   5/1986  Shimozato et al.
4,786,490 A   11/1988 Yoshida et al.
(Continued)

FOREIGN PATENT DOCUMENTS

BE   1010720 A3   12/1998
EP   0 756 022 A2   1/1997
(Continued)

OTHER PUBLICATIONS

Luo, Alan A., "Magnesium casting technology for structural applications". Journal of Magnesium and Alloys 1 (2013) 2-22.*
(Continued)

*Primary Examiner* — Bret P Chen
(74) *Attorney, Agent, or Firm* — Reinhart Boerner Van Deuren P.C.

(57) ABSTRACT

A method deposits a metal alloy coating on a substrate using a vacuum deposition facility. The facility is equipped with a vapour generator/mixer comprising a vacuum chamber enclosure provided with an inlet and an outlet for the substrate. The enclosure includes a vapour deposition head and an ejector is provided to create a jet of metal alloy vapour of sonic velocity towards the surface of the substrate and perpendicular thereto. The ejector is in sealed communication with a separate mixer device, which is itself connected upstream to at least two crucibles respectively, these containing different metals in liquid form, each crucible being connected to the mixer by its own pipe. The method uses a series of partitions to create alternating layers of metal vapours. The metal vapours enter the mixer inlet of the
(Continued)

mixer at a velocity from 5 to 50 m/s to provide better homogeneity.

6 Claims, 9 Drawing Sheets

(51) Int. Cl.
*C23C 14/54* (2006.01)
*C23C 14/56* (2006.01)

(52) U.S. Cl.
CPC .............. *C23C 14/562* (2013.01); *Y02T 50/67* (2013.01); *Y02T 50/6765* (2018.05)

(56) References Cited

U.S. PATENT DOCUMENTS

| | | | |
|---|---|---|---|
| 5,002,837 A * | 3/1991 | Shimogori | C23C 14/16 428/621 |
| 5,350,598 A | 9/1994 | Kleyer | |
| 5,776,254 A | 7/1998 | Yuuki et al. | |
| 6,399,017 B1 * | 6/2002 | Norville | B22D 17/007 164/312 |
| 6,423,144 B1 | 7/2002 | Watanabe | |
| 7,220,450 B2 | 3/2007 | Schade van Westrum et al. | |
| 2002/0192375 A1 | 12/2002 | Sun et al. | |
| 2004/0022942 A1 * | 2/2004 | Schade van Westrum | C23C 14/24 427/248.1 |
| 2004/0241189 A1 | 12/2004 | Ishii et al. | |
| 2006/0096674 A1 | 5/2006 | Choquet et al. | |
| 2008/0085226 A1 | 4/2008 | Fondurulia et al. | |
| 2009/0098280 A1 | 4/2009 | Tahon | |
| 2009/0251989 A1 | 10/2009 | Pfefferle et al. | |
| 2010/0104752 A1 | 4/2010 | Choquet et al. | |
| 2011/0000431 A1 * | 1/2011 | Banaszak | C23C 14/16 118/694 |
| 2012/0160166 A1 * | 6/2012 | Hass | C23C 14/0021 118/719 |

FOREIGN PATENT DOCUMENTS

| | | |
|---|---|---|
| EP | 1 174 526 A1 | 1/2002 |
| EP | 1 972 699 A1 | 9/2008 |
| EP | 2 048 261 A1 | 4/2009 |
| FR | 2 843 130 A1 | 2/2004 |
| WO | WO 97/47782 A1 | 12/1997 |
| WO | WO 02/06558 A1 | 1/2002 |
| WO | WO 02/14573 A1 | 2/2002 |
| WO | WO 2008/002559 A2 | 1/2008 |
| WO | WO 2009/153865 A1 * | 12/2009 ................ B29F 9/10 |

OTHER PUBLICATIONS

Yumoto, Atsushi, et al., "Graded TiN Coating by Supersonic Free-Jet PVD Combined with Reactive Plasma". Materials Transactions, vol. 43, No. 11 (2002) pp. 2932-2934.*

Malone, G.A., et al., "High Temperature Barrier Coatings for Refractory Metals". NASA Contractor Report 195475, Jun. 1995, pp. 1-136.*

Hass, D.D., et al., "Reactive vapor deposition of metal oxide coatings". Surface and Coatings Technology 146-147 (2001) 85-93.*

Laurent Baptiste, et al; Electromagnetic levitation: A new technology for high rate physical vapour deposition of coatings onto metallic strip; Surface & Coatings Technology 202; 2007; pp. 1189-1193; Elsevier B.V.

Ohjoon Kwon; Next Generation Automotive Steels at POSCO; Jan. 30, 2008; 26 pages; POSCO Technical Research Labs/R&D Innovation Technical Research Laboratories.

* cited by examiner

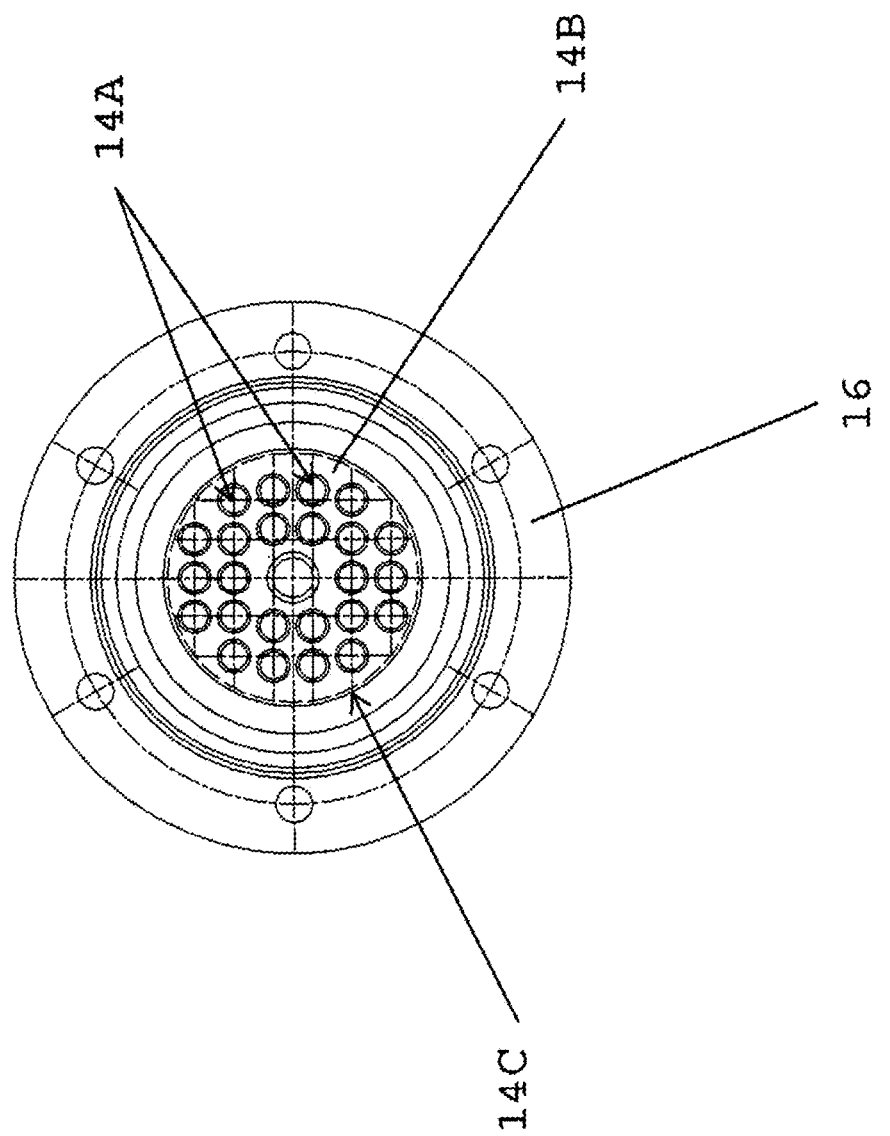

INDUSTRIAL VAPOR GENERATOR FOR DEPOSITING AN ALLOY COATING ON A METAL STRIP

CROSS-REFERENCE TO RELATED APPLICATIONS

This patent application is a divisional of U.S. patent application Ser. No. 13/140,061, filed Aug. 3, 2011, which is a National Stage Entry of PCT/EP2009/067448, filed Dec. 17, 2009, which claims priority to European Application No. 08172179.7, filed Dec. 18, 2008, the entire teachings and disclosure of which are incorporated herein by reference thereto.

FIELD OF THE INVENTION

The present invention relates to an industrial vapor generator for continuously vacuum coating a substrate in motion, more particularly a metal strip, using metallic vapors in order to form a layer of metal alloy on its surface, so as to give it excellent resistance to corrosion while preserving good drawing and weldability characteristics.

BACKGROUND OF THE INVENTION

It has been known since the late 1980s that the deposition of certain alloys, such as ZnMg, on the surface of a steel strip plays a role in protecting steel. The excellent corrosion resistance of the ZnMg alloy is attributed to the nature of the corrosion products formed on the surface of the strip in an extremely dense layer acting as a barrier film.

Such an alloy deposition is generally only possible by the usual techniques, such as electrolytic deposition, hot dipping, etc., within certain composition limits. Thus, at atmospheric pressure, contamination of the liquid metal bath by the oxygen in the air may occur, which forms oxide mattes on the surface of the bath.

If one wishes to obtain extended thickness and composition ranges, the only possible solution is often the vacuum evaporation of the liquid metal, pure or in alloy form (PVD technique, Pressure Vapor Deposition).

In the context of this technique, it is known to place the substrate in a vacuum enclosure maintained at a low temperature and comprising a crucible of molten metal. The deposition is then achieved on all the walls with a temperature below the temperature of the metal vapor. To increase the deposition yield on the substrate and prevent waste, it is therefore interesting to heat the walls of the enclosure.

In document WO-A-97/47782, a method is described for continuously coating a moving substrate in which the metal vapor is generated by induction heating a crucible containing a bath formed by the coating metal in a vacuum enclosure. The vapor escapes from the crucible via a pipe that brings it towards an outlet orifice, preferably calibrated, so as to form a jet oriented towards the surface of the substrate to be coated. The use of an orifice in the form of a longitudinal slot with a narrow section allows to regulate the vapor mass flow rate, at constant sonic velocity along the slot (sonic throat), which procures the advantage of obtaining a uniform deposition. This technique will henceforth be designated using the acronym "JVD" (Jet Vapor Deposition).

This technology does, however, have several flaws, in particular:
the constant supply of liquid metal involves providing its return to the vat in one or several points;
the liquid metal comprising impurities, there is a concentration of these impurities on the surface of the bath after evaporation, which reduces the flow rate. The uniformity of the bath is necessary to obtain a uniform deposition. It involves bringing cool liquid at a location whilst removing the used liquid at another location. One solution would be skimming the surface or recycling the load, but any mechanical operation is made difficult in a vacuum;
the difficulty of adapting the evaporation slot to a variable bandwidth, which involves concealing means on either side of the slot, and hence the production of vapor sealing under vacuum and at 700° C., which is not easy to do;
the difficulty of concealing the slot when the movement of the strip is interrupted, which would involve the presence of a sealing linear valve over a typical length of 2 meters or more;
the major thermal inertia of the system (at least several minutes);
the heating, done by vacuum induction, requires passing all of the electrical heating power via electrical connectors through the vacuum sealing wall, which does not facilitate the accessibility and maintainability of the facility.

Furthermore, the state of the art does not provide a satisfactory solution to the need to perform the co-deposition of two distinct metals, involving the mixture of two jets leaving the evaporator. The use of intermediate mixing boxes with baffles did not provide a sufficiently convincing result.

A first way to proceed for depositing an alloy coating on a strip is to first deposit a layer of the first metal, such as zinc, for example by hot dipping, electrolysis or vacuum magnetron spraying, then deposit a layer of a second metal, such as aluminum, for example in a vacuum, and to finally perform a thermal diffusion treatment, for example low temperature annealing, which produces the alloy.

The advantage of this method is that it has a simple design, allowing for a step by step regulation.

A first drawback is, however, multiplying the steps of the method, and therefore its cost. In particular, thermal diffusion treatment consumes a significant amount of energy. For example, if the relative thickness of the coating is 1%, the required energy must be provided to the entire thickness of the finished product, i.e. 100%, which corresponds to several megawatts for an industrial line.

Thus, document WO-A-02/14573 describes the development of a coating from a base zinc plated coating obtained by a conventional hot dipping or electro-galvanizing method, which in turn is then vacuum coated with magnesium. Rapid induction heating allows to postpone the fusion deposition for several seconds and to obtain, after cooling, a favorable microstructural distribution of alloyed phase ZnMg in the entire thickness of the layer.

Document FR 2 843 130 A describes a method for coating a surface with a metal material, according to which:
a first coating of said material is achieved using a metal or metal alloy layer,
a thermal treatment is achieved on the first coating using a rapid heating means so as to bring the surface of said first coating to a temperature below the melting temperature of the metal material, and
a second coating is deposited from a metal or metal alloy.

The Applicant has also proposed an industrial dual-layer electro-galvanized/ZnMg alloy product obtained by PVD (EP-A-0 756 022), as well as an improvement of the method with an infrared heating system to alloy the magnesium with the zinc in order to minimize the formation of the fragile intermetallic FeZn phase.

A second drawback is that not all types of steel accept this thermal treatment. For example, BH (bake hardening) steels are malleable, deformable, anti-corrosion steels intended for automobiles, which have instabilities that are displaced during curing of the paint, which causes the sheet metal to harden. This product therefore has a difficulty related to hardening that results from its reheating. A direct alloy deposition would therefore allow to overcome these drawbacks.

Another method is therefore to produce metal coating alloys by direct deposition of the alloy without thermal treatment, by rigorously controlling the concentration of both metals in the crucible. For example, if 50% Zn and 50% Mg are placed in the crucible, an alloy of 85% Zn/15% Mg is obtained, given the different evaporation speeds. However, this control involves great difficulties in managing the system, in light of the continuous concentration variation in the crucible. In particular, it is difficult to ensure homogeneity in the crucible, especially if it is not of circular section. For example, POSCO (publication: "*Next Generation Automotive Steels at POSCO,*" January 2008) proposes a coating obtained by PVD at very high velocity, with a high vapor yield and high energy yield, in particular in the form of an alloy co-deposition from a single evaporation source.

Still another method according to the state of the art consists in using two crucibles, each generating a type of vapor, both generated vapors being oriented by a channel towards a mixing device, from which the alloy is deposited on the strip.

Patent BE 1010720 A3 describes a method for continuously coating a substrate in motion using a metallic alloy in vapor phase, in which the various components of the alloy are evaporated into suitable distinct elements and whereof the different metal vapors obtained are channeled towards the location where the deposition occurs. One of the vapors coming from the metal baths with the components of the metal alloy plays the role of a propellant element relative to the other metal vapors present.

In document WO-A-02/06558, a ZnMg coating is obtained in a vacuum by evaporating from two crucibles, one with zinc and the other with magnesium. Before they are projected on the strip, the vapors are mixed in a throttling device in the form of plates provided with holes or slots, which allows to obtain maximum sonic velocity and vapor flow rate. However, the high speed of the vapors before mixing makes it very difficult to obtain a homogenous mixture by molecular diffusion.

In L. Baptiste et al., "*Electromagnetic levitation: A new technology for high rate physical vapour deposition of coatings onto metallic strip*", Surface & Coatings Technology 202 (2007), 1189-1193, a method is proposed based on the levitation technology for conductive materials in high-frequency electromagnetic fields. Through a suitable design of the induction coils, it is possible to obtain high power densities and metals at low vapor pressures such as aluminum, nickel, or copper, as well as their alloys can easily be evaporated. The produced vapor is guided towards the substrate by a specially designed vapor distribution system, which allows to obtain good uniformity of the coating and very wide use of the vapor.

Document U.S. Pat. No. 5,002,837 describes the evaporation deposition of a dual-layer Zn/ZnMg coating with a completely alloyed $Zn_2Mg$ or $Zn_2Mg/Zn_{11}Mg_2$ phase.

Patent application EP-A-2 048 261, in the name of the Applicant, discloses a vapor generator for depositing a metal coating on a steel strip, comprising a vacuum chamber in the form of an enclosure, provided with means for ensuring a vacuum state therein relative to the outside environment and provided with means allowing the strip to enter and exit, while being essentially sealed relative to the outside environment. This enclosure covers a vapor deposition head, called ejector, configured to create a metallic vapor jet at sonic velocity towards and perpendicular to the surface of the strip. The ejector is in sealed communication via a supply duct with at least one crucible containing a coating metal in liquid form and situated outside the vacuum chamber. The vapor generator comprises means for regulating the flow rate, pressure, and/or speed of the metallic vapor in the ejector. Document EP-A-2 048 261 belongs to the state of the art pursuant to Article 54(3) EPC.

Prior patent application EP-A-1 972 699, in the name of the Applicant, discloses a method and facility for coating a substrate according to which a layer of metallic alloy comprising at least two metal elements is continuously deposited on said substrate, using the vacuum deposition facility comprising a vapor jet coating device, allowing to project on the substrate a vapor comprising the metallic elements in a predetermined relative and constant proportion, the vapor being brought to sonic velocity beforehand. The method is more particularly intended for the deposition of ZnMg coatings.

AIMS OF THE INVENTION

The present invention aims to provide a solution that allows to overcome the drawbacks of the state of the art.

In particular, the invention aims to achieve the following objectives:
  no liquid source in the vacuum enclosure for deposition;
  ease of production;
  very significant reduction in the mixing length of two or more metallic vapors;
  possibility of very fast differentiated and adjustable regulation of the individual alloy metal content levels;
  easy accessibility and maintenance of the crucible(s);
  excellent uniformity of the evaporation and mechanism simple for adaptation on strip widths that can exceed 2 meters;
  maximized vapor flow rate;
  easy regulation of the vapor flow rate, by controlling the electrical power and/or temperature of the evaporation surface;
  design of a very flexible facility for alloy depositions entirely in vacuum.

Main Characteristic Elements of the Invention

A first object of the present invention relates to a facility for depositing under vacuum a metal alloy coating on a substrate, preferably a metal strip in continuous motion, equipped with a vapor generator-mixer comprising a vacuum chamber in the form of an enclosure, provided with means for ensuring a vacuum state therein relative to the external environment and provided with means for the inlet and outlet of the substrate, while being essentially sealed relative to the external environment, said enclosure comprising a vapor deposition head, called the ejector, configured so as to create a jet of metal alloy vapor at sonic velocity towards the surface of the substrate and perpendicular thereto, said ejector being in sealed communication with a separate mixer device, which is itself connected upstream to at least two crucibles, respectively, and containing different metals M1 and M2 in liquid form, each crucible being connected to the mixer by its own pipe.

According to preferred embodiments of the facility for depositing under vacuum a metal alloy coating on a substrate according to the present invention, the latter also comprises one or more of the following features in combination with the basic features of the facility:

- the mixer comprises a cylindrical envelope inside which, along the axis of the envelope, are located a plurality of tubes, arranged regularly and connected at the inlet to the supply pipe of a first metal vapor, the supply pipe of a second metal vapor being connected, laterally relative to the cylindrical envelope, to the interstitial space between the tubes. The tubes and the interstitial space having outlet orifices all emerging on a space where the mixing of the vapors can occur;
- the mixer comprises a series of partitions allowing to separate at least two entering vapors, these partitions creating orifices allowing the two vapors to exit before they are mixed in the form of alternating layers of both vapors in the direction of the exiting flow;
- each of said pipes comprises a proportional valve, optionally with a head loss device;
- the proportional valve is of the butterfly valve type;
- the ejector comprises a longitudinal exit slot for the vapor, acting as a sonic throat, extending over the entire width of the substrate and a filtering medium or a head loss member made of sintered material, preferably made of titanium or in the form of a metal sieve with sintered stainless steel fibers, so as to equalize and rectify the velocity vectors of the vapor leaving the ejector;
- the facility comprises means for adjusting the length of the slot to the width of the substrate;
- said means comprise a means for rotating the ejector around its supply pipe;
- the ejector, the mixer, the pipes and the crucibles are thermally isolated from the outside environment and heated by a radiation heater;
- the facility comprises optional heating means for the vacuum enclosure;
- a first porous surface is arranged at the outlet of the mixer tubes and/or a second porous surface is arranged at the outlet of the interstitial space of the mixer, so as to balance the pressures of the two respective vapors;
- an additional pipe is mounted in bypass on the supply pipe of the first metal M1 towards the mixer, having an isolating valve and leading to an additional ejector in the vacuum chamber, said additional ejector being configured to create a vapor jet of the first metal M1 at sonic velocity towards and perpendicular to the surface of the substrate, the portion of the supply pipe of the first metal M1 leading to the mixer being provided with an additional valve intended to isolate the first crucible from the mixer.

A second object of the present invention relates to a method for depositing a metal alloy coating on a substrate, preferably a metal strip in continuous motion, using the facility described above, wherein:

- the flow velocity of each of the metal vapors is regulated at the inlet of the mixer so that said flow velocity of said vapors at the inlet of the mixer is lower by a factor of 10, preferably by a factor of 50, than sonic velocity;
- the concentration of each metal is independently adjusted during the mixture of the vapors to be deposited on the substrate.

Advantageously, the method is implemented so that the flow velocity is less than 100 m/s, preferably from 5 to 50 m/s.

Still advantageously, according to the method of the invention for implementing the above-mentioned facility for depositing under vacuum a metal alloy coating on a substrate, preferably a metal strip in continuous motion, said additional valve being closed and said isolation valve being open, the first metal M1 may be deposited on the substrate at the level of the additional ejector and the second metal M2 may be deposited at the level of the ejector in the vacuum chamber, successively.

Still advantageously, according to the method for implementing the above-mentioned facility for depositing under vacuum a metal alloy coating on a substrate, preferably a metal strip in continuous motion, said additional valve being open and said isolating valve being closed, the M1+M2 alloy is directly deposited on the substrate at the level of the ejector in the vacuum chamber.

Still advantageously, according to the method for implementing the afore-mentioned facility for the depositing under vacuum a metal alloy coating on a substrate, preferably a metal strip in continuous motion, both the additional valve and the isolating valve being open, the first metal M1 is deposited on the substrate at the level of the additional ejector and the M1+M2 alloy is directly deposited at the level of the ejector in the vacuum chamber, successively.

Advantageously, according to the afore-mentioned methods, the metal or alloy deposition(s) are followed by a thermal treatment.

BRIEF DESCRIPTION OF THE DRAWINGS

FIGS. 2A to 2C show detailed views of the metal vapor mixer according to one preferred embodiment of the present invention.

DETAILED DESCRIPTION OF PREFERRED EMBODIMENTS OF THE INVENTION

The solution recommended according to the present invention consists in using an offboard evaporation crucible, i.e. that is dissociated from a JVD evaporation head with a longitudinal slot or calibrated holes for the vapor outlet, herein after called ejector. The general principle of such an offboard crucible device, in the case of a single vapor species to be deposited, is described in detail in patent application EP-A-2 048 261.

The present patent application is based on the deposition of an alloy coating and therefore requires at least the use of two different sources of metal vapor.

Figure 1:
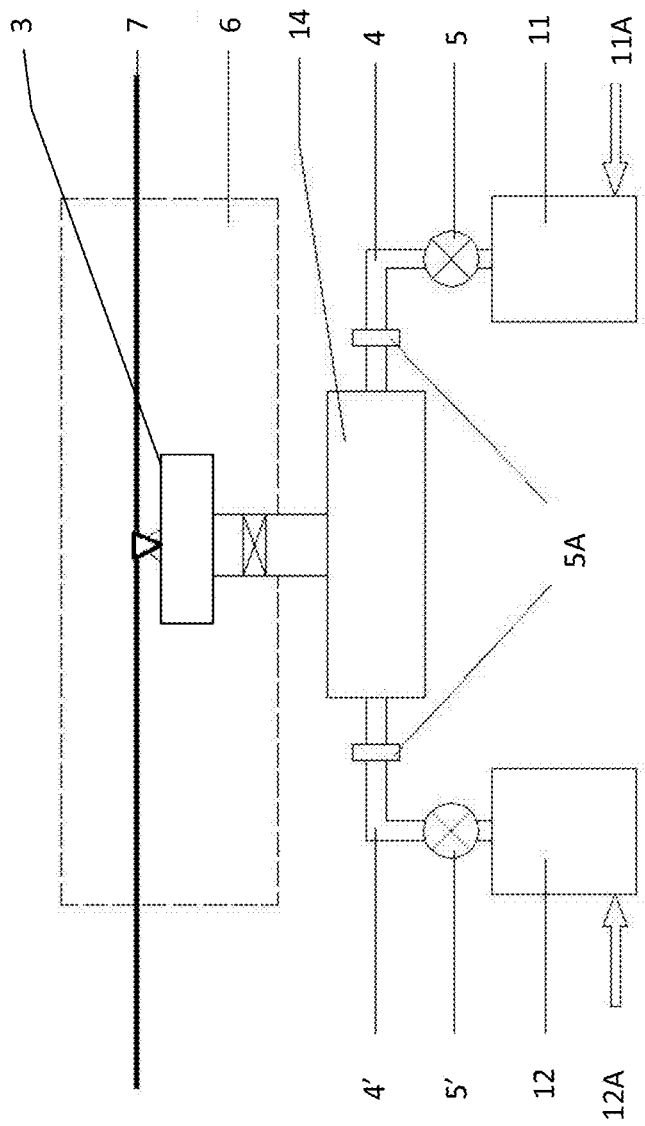
FIG. 1 diagrammatically shows a vapor generator with a mixer according to the invention, which allows an alloy deposition of two pure metals on the substrate.

In the case where one wishes to mix the vapors of two different coating metals, as shown in FIG. 1, two melting chambers or crucibles 11,12 containing two different pure metals (for example, zinc and magnesium,) respectively, are each connected by a pipe 4,4' provided with a valve 5,5' to a mixing chamber 14 coupled to the ejector 3. The concentration of both metals in the mixture is adjusted on one hand using the energy supplied and on the other hand using respective proportional valves 5,5', which simplifies the management problem. The bulk of this system is advantageously reduced (see below).

Owing to the present valves, this device allows to finely and quickly regulate the vapor flow. In this respect, the choice of cylindrical pipes allows to obtain a good high-temperature vacuum sealing and the use of a proportional valve 5, for example a butterfly valve as commercially available, possibly with a head loss device 5A, to regulate the vapor flow rate. The deposited thickness depends on the metal vapor flow rate, the flow rate itself being proportional to the useful power supplied. When the power is modified, it is possible to simultaneously change the position of the valve in order to adapt the head loss to the new operating point. The mass flow rates also change instantaneously, which makes transients practically nonexistent during the change of position of the valve.

The ejector 3 is a box with a length greater than the width of the strip to be coated. This device comprises a filtering medium or a medium creating a head loss (not shown) to ensure the equalization of the vapor flow rate over the entire length of the box. The ejector 3 is heated to a temperature above that of the metal vapor and is thermally insulated on the outside. A calibrated slot or a series of holes ensure the projection, at the speed of sound, of the metal vapor on the strip 7. Depending on the density of the metal, the velocities obtained typically range from 500 to 800 m/s. The sonic throat over the entire length of the slot very effectively completes the filtering medium to ensure the uniformity of the deposition on the strip. The size of the slot or holes S imposes the volume flow rate ($k \times v_{son} \times S$, $k \sim 0.8$). The speed of sound, $v_{sound}$, is reached in the ejector at the outlet of the slot or holes. Owing to the presence of a head loss element in the pipe (valve 5), the vapor flow rate may be regulated and imparted with a low initial pressure.

In the state of the art (see WO-A-02/06558), the two supply pipes of the ejector are provided with restrictions in the form of calibrated orifices. It is then in that location that the speed of sound is obtained (several hundreds of m/s). If a mixing time t0 is necessary to obtain perfect mixing, then if the vapors have a speed v0 at the outlet of these calibrated holes, the mixing member should have a length v0×t0. For example, if v0=500 m/s and t0=0.2 s, then v0×t0=100 m ! As a result, with such a principle, the mixture actually deposited is hence never perfect. This results in homogeneity problems with the coating.

However, the device according to the invention, described in FIG. 1, allows to mix the vapors this time at a low speed owing to the head loss elements incorporated into the system such as valves. The mixing is done between vapors having regulated flow velocities and typically between 5 and 50 m/s at the inlet of the mixer (these flow velocities therefore being lower by at least a factor of 10, preferably by a factor of 50, than sonic velocity), which allows to reduce the homogeneity length by a factor ranging from 10 to 100 (therefore typically several meters).

For example, tests done on the Applicant's JVD pilot line allowed to produce coatings having magnesium content levels between 0 wt % and 15.6 wt %.

It was possible to validate the partial magnesium and zinc pressures owing to these tests from chemical analyses done on the produced coatings. The pressures obtained in the zinc crucible were between 1956 Pa and 8736 Pa, whereas those obtained in the magnesium crucible were between 241 Pa and 1467 Pa.

The total pressures (Zn+Mg) in the mixer obtained during these same tests were between 241 Pa and 1440 Pa. The velocities of the metal vapors in the mixer calculated from this experimental data are between 9.81 m/s and 22.7 m/s, or between 0.02 and 0.04 Mach (therefore much lower than the speed of sound).

Figure 5:
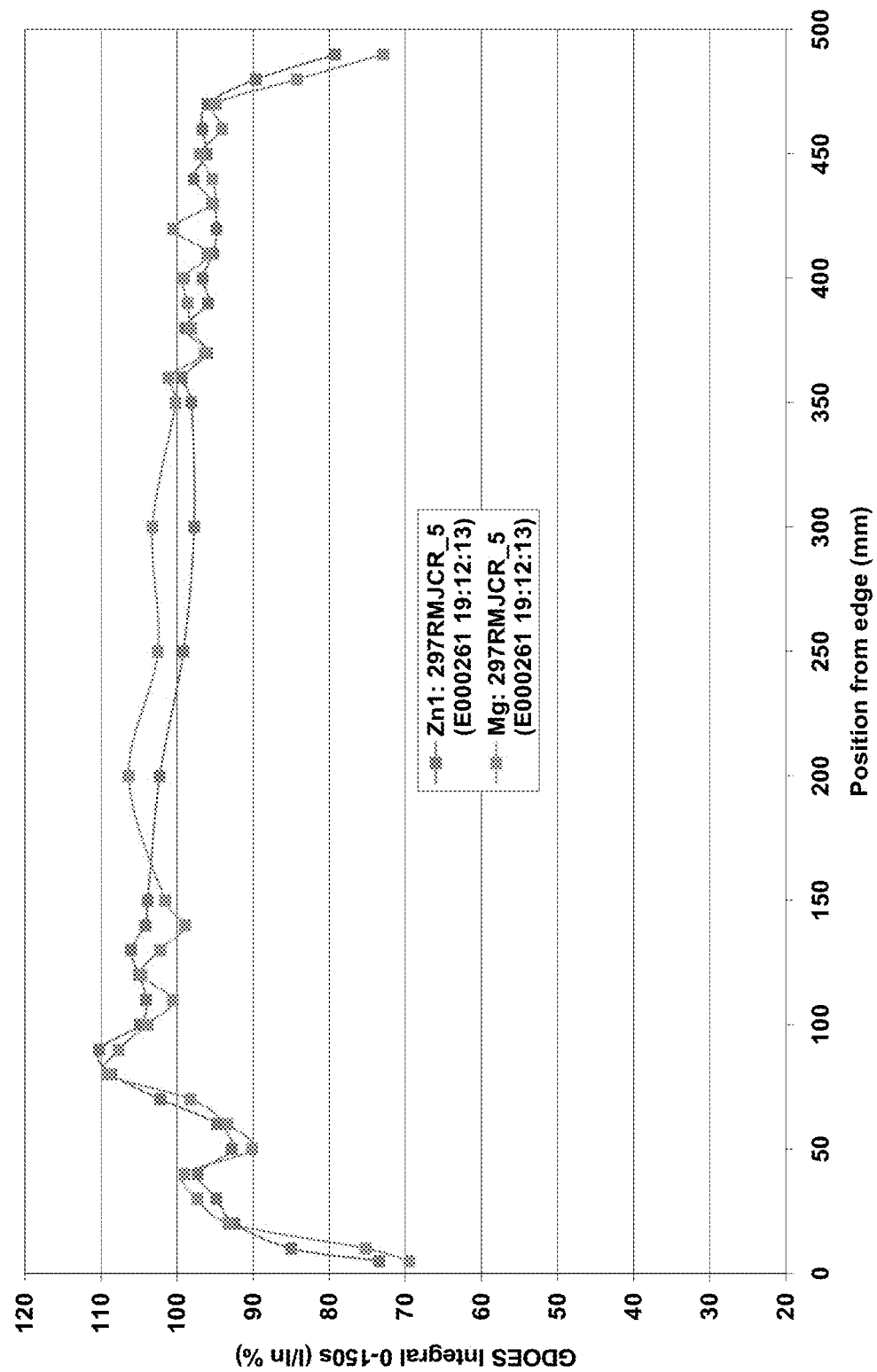
FIG. 5 shows the analysis results of a ZnMg coating by glow discharge optical emission spectroscopy (GDOES) during implementation tests of the invention on a pilot line, expressed in zinc and magnesium weight (in % of the targeted nominal values, I/In), obtained at various points over the entire width of the coated strip.

Furthermore, the same chemical analyses demonstrated that the mixing of vapors achieved with a facility as described in this invention allowed to perform depositions having a uniform composition over the entire width of the strip. FIG. 5 shows, as an example, the zinc and magnesium weights (expressed in percentage of the targeted nominal values) obtained by analysis at various points over the entire width of the strip coated using this method.

Figure 6:
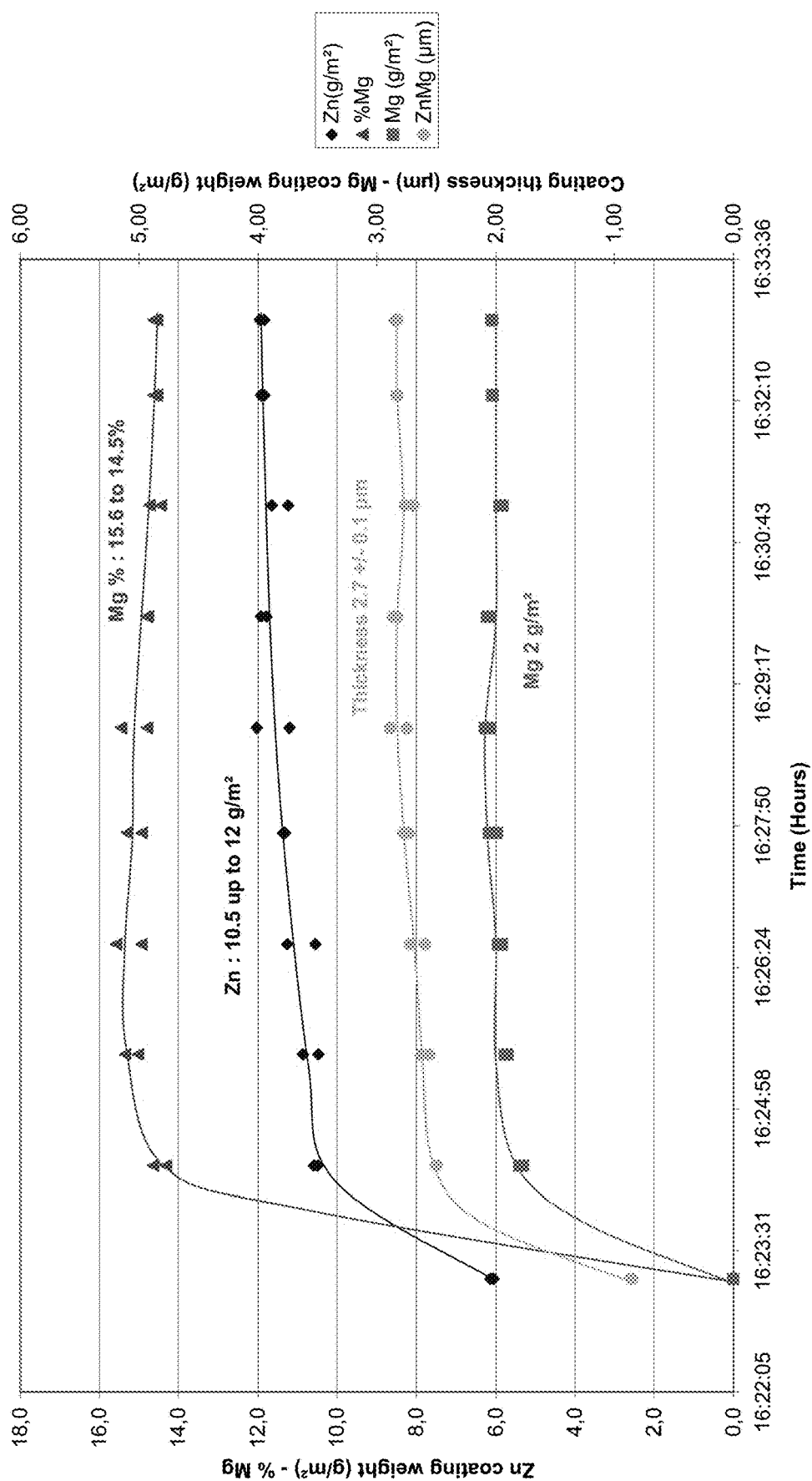
FIG. 6 shows the composition of an alloy of the ZnMg type as well as the evolution of the layer weight obtained as of the moment when the valves of the JVD facility are open (ICP analysis along the strip).

Lastly, FIG. 6 shows the evolution of the composition of a standard alloy as well as the evolution of the weight of the obtained layer as of the moment when the valves of the JVD facility are open. In fact, this extreme example demonstrates that the system established according to this invention allows to manage the transients of an industrial line (stop, speed change, format change, etc.), since the desired target is obtained as soon as the valves are opened and remains stable all through the rest of the production campaign.

Furthermore, in the case of mixers, the principle of increasing the molecular diffusion is known if several layers of two gases A and B are alternatingly put in contact, rather than a layer of A and a layer of B. The number of separating walls in the diffuser allows to further substantially reduce the diffusion length and the mixing time. The application of this principle in a mixer of the type described above allows to reduce the mixing length to a few centimeters, and therefore to design a smaller mixer, which is an advantage given the complexity of the system (vacuum ejector, high temperature).

Figure 2A:
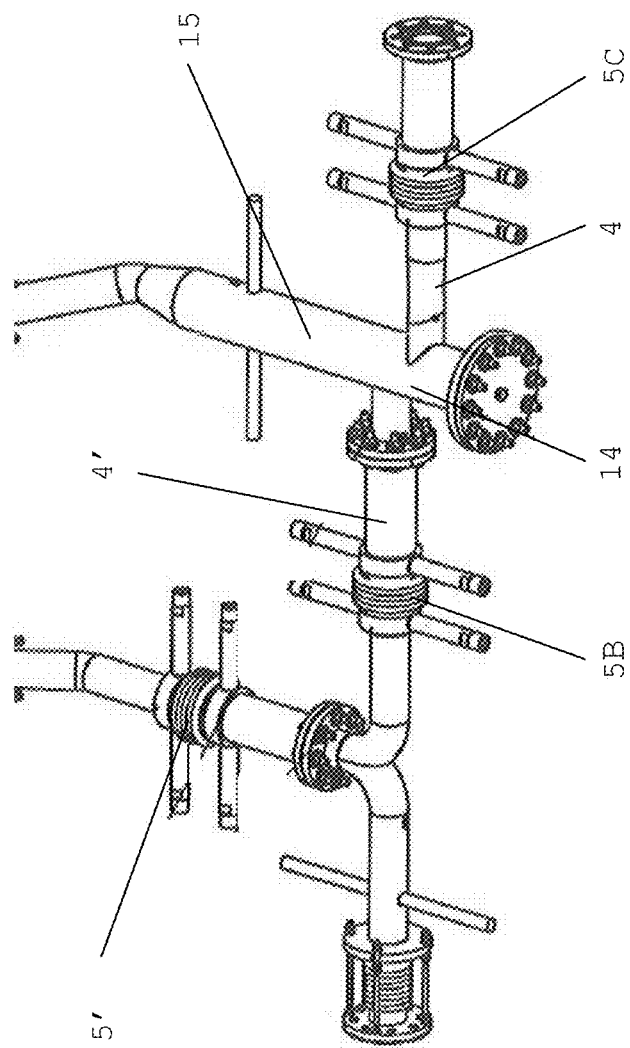
Figure 2B:
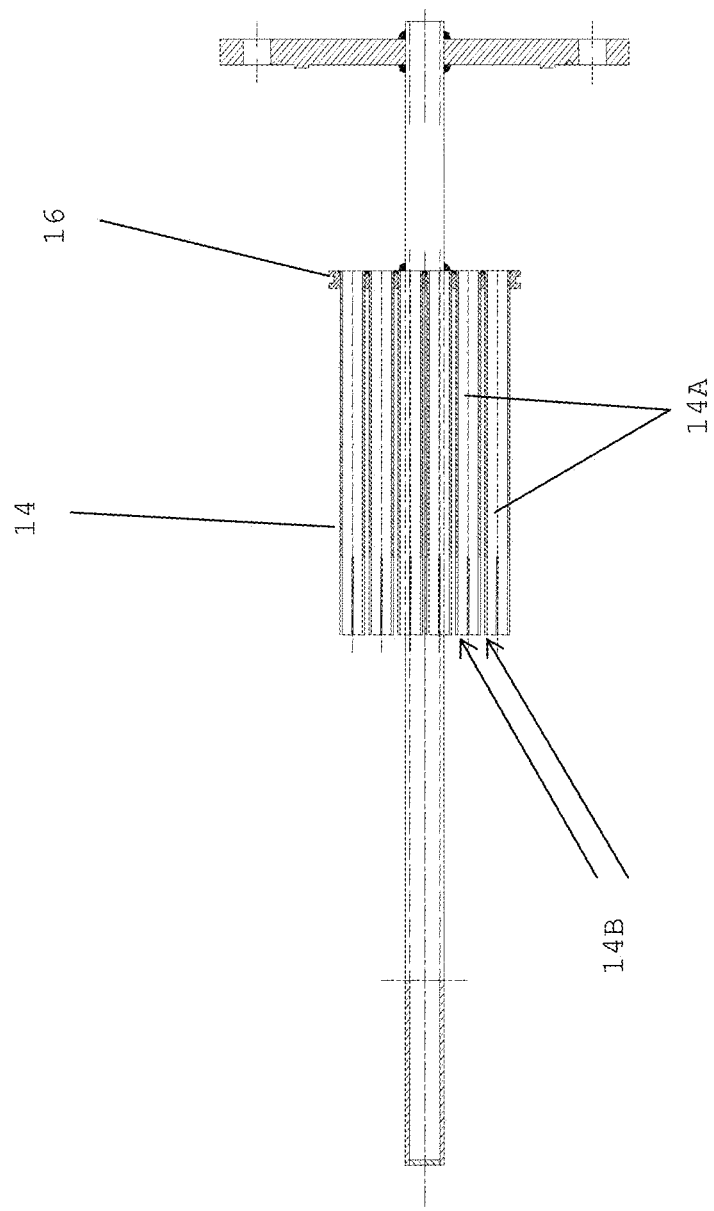

The feasibility of such a mixer working with metal vapors at low velocity and alternative distribution was studied by digital simulation. The result led to the design of a preferred embodiment according to the invention, shown in FIGS. 2A to 2C.

According to this preferred embodiment, the mixing device 14 is in the form of a cylindrical envelope 14C whereof the inside comprises a plurality of tubes 14A arranged regularly and connected to the supply pipe 4' of a first metal vapor M1, along the axis of said cylinder. The supply pipe 4 of the second metal vapor M2 is connected, laterally to the cylindrical envelope, to the interstitial space 14B located inside said cylindrical envelope 14C, between the tubes 14A. The tubes 14A are maintained and fastened on a flange 16. Both the tubes 14A and the interstitial space 14B all emerge at the outlet on the mixing space strictly speaking 15.

The choice of a cylindrical symmetry for the design of the mixing device is of course related to its good pressure resistance.

The use of an offboard low-speed system, owing to outer adjustment valves, with a vapor mixer has certain advantages over the co-evaporation known from the state of the art. It is in fact much easier to adjust the vapor content required for each metal owing to the combined action of the power and the respective individual valves on each vapor. The power allows to adjust the mixed quantities and the valves allow to quickly set and modify the operating point. It is in fact possible, owing to the head loss of the valve, to vary the pressure without modifying the temperature behind the valve. Conversely, according to the state of the art, the pressure modification is always subject to the temperature variation, therefore to the heating, and generates inertia and transients.

The required pressure is different for the two metals M1 and M2 (e.g. $T_{evap}(Zn)=600°$ C. and $T_{evap}(Mg)=700°$ C.) because they do not have the same density or physical characteristics.

Under these conditions, it is possible to balance the different pressures of the two respective gases by adding to the circuit two additional head loss elements in the form of porous surfaces (not shown). A first porous surface is arranged at the outlet of the tubes 14A (metal M1) and a second porous surface is arranged at the outlet of the interstitial gas (metal M2). In this case, the re-equalizing of the pressures or of the speeds is achieved by friction, i.e. by heat transfer, and the adiabatic expansion of the gas (without heat transfer) that would lead to recondensation is thereby avoided.

The advantage of the invention in this respect is to be able to manage gases with different temperatures or pressures at the inlet, since head losses are used in the form of valves that allow, in combination with the energy source, to adjust the content levels of the two metal vapors.

Figure 3A:
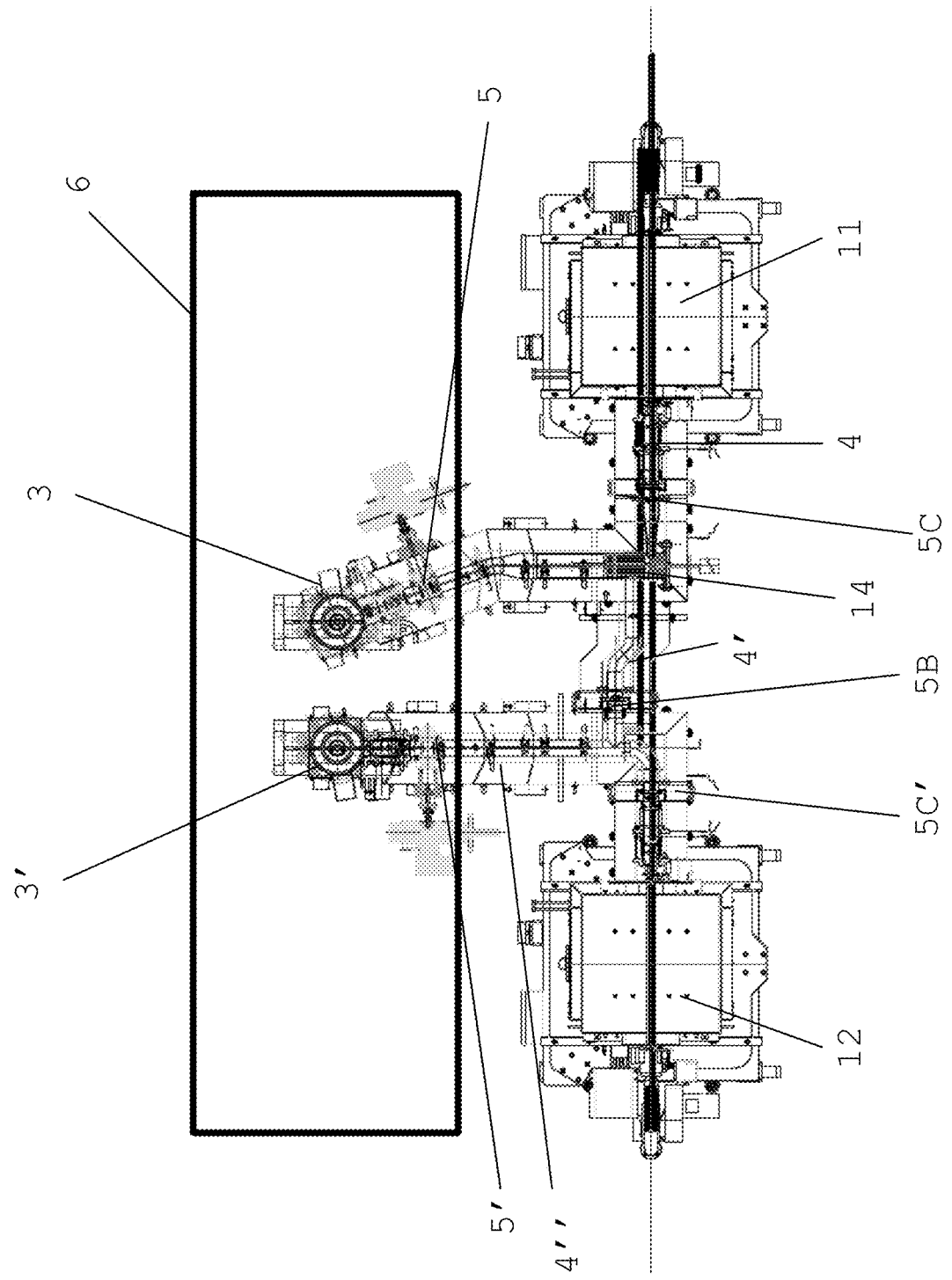
FIGS. 3A and 3B diagrammatically show a planar view and an elevation view, respectively, of a complete bimodal facility according to one preferred embodiment of the present invention, which can be used either for the deposition of two distinct metal species on a metal strip, or for a direct alloy deposition using the aforementioned mixer.
Figure 3B:
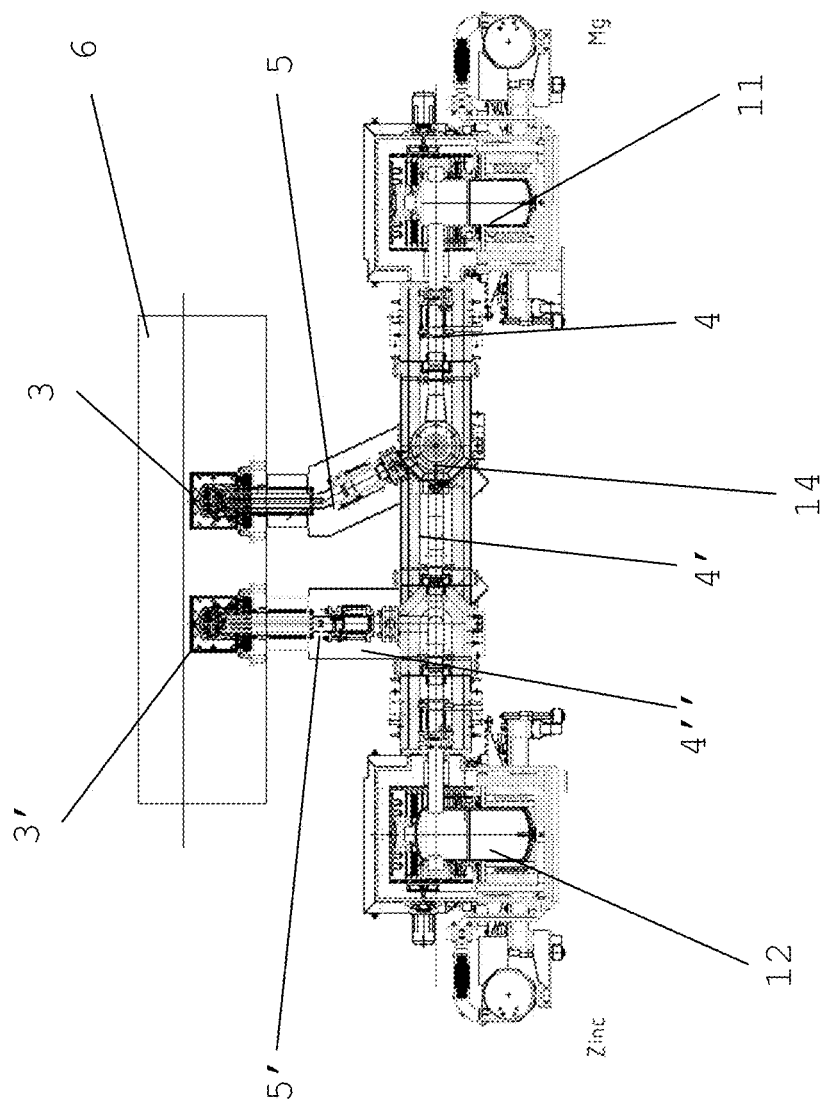
Figure 4:
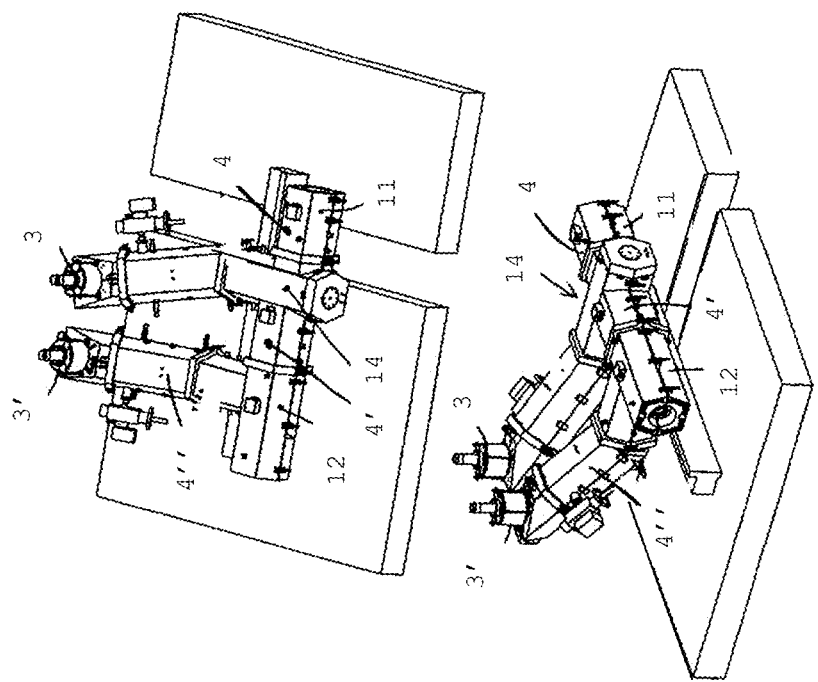
FIG. 4 shows more perspective views of the pipes of the facility according to FIGS. 3A and 3B.

Another object of the invention is to propose a "bimodal" vacuum deposition facility, shown in FIGS. 3A, 3B and 4, which allows the follow deposition forms:
- deposition of M1, then of M2, both depositions being in a vacuum,
- deposition of M1+M2, in the form of a mixing achieved as described above, the alloy deposition being in a vacuum;
- deposition of M1+(M1+M2), in the form of a mixing achieved as described above, the complex alloy deposition being in a vacuum.

As shown in the figures, the part of the facility that provides the metal M2 from the crucible 11 is provided with a mixer 14. The facility can operate independently for the deposition of M1 on the metal strip at the level of the ejector 3' in the vacuum chamber 6, if M1 is not mixed with M2, i.e. if a valve 5B is closed in the portion of the pipe 4' conveying M1 in the mixer (when this valve 5B is open). Likewise, in the case where this valve 5B is closed, the portion of the facility supplying M2 from the crucible 11 can operate autonomously and allow the deposition of M2 in the vacuum chamber 6, for example above the layer of M1 already deposited (for a left-to-right travel direction of the strip in FIG. 3A). However, if the aforementioned valve 5B is open, the mixing M1+M2 will be achieved in the mixer 14 and deposited on the strip at the level of the ejector 3 in the vacuum chamber 6. Other alloy deposition possibilities can be considered with this facility such as a deposition of M1 at the level of the ejector 3' followed by a later deposition of the mixture M1+M2 at the level of the ejector 3. It can in fact be advantageous to perform a deposition of zinc and magnesium alloy on a sub-layer of zinc, which is relatively ductile, in order to prevent chalking of the coating.

In FIG. 3A, the proportional valves (5,5') were lined by valves (5C,5C') at the outlet of the respective crucibles.

The present invention fits into a context of evolution of the technical field that approaches "full PVD" for the following reasons:
- in electrolytic deposition, the increase of the strip velocity involves the increase of the required currents (millions of amperes) and therefore of the consumption (megawatts), which is prohibitive in terms of energy consumption; furthermore, this technology creates spatters, which limits the maximum strip velocity to about 160 meters/minute;
- hot dipping for the deposition of a first layer of zinc encounters the physical limitation related to centrifuging, the effectiveness of which decreases at high velocity; the admissible strip velocity limit is about 180 meters/minute;
- in the case of vacuum deposition, this limit of 160-180 meters/minute disappears because a damaging liquid phase is no longer present. The metal vapors are at the speed of sound in the deposition enclosure and there is therefore no longer any chemical, electrical or physical limitation. In the future, we can hope to reach 200-220, or even 300 meters/minute, owing to the technology of the invention.

Advantages of the Invention

The system according to the invention allows to obtain a very good uniformity of the temperature and velocity of the deposited vapor, while being reliable and accessible and having very low response times. The invention thus meets the requirements for industrialization of the method very well.

Furthermore, the offboard device according to the invention is particularly suited to alloy deposition by vapor mixing because it allows to adjust the deposited chemical composition without having to modify the composition of a liquid alloy. The vapor mixing is thus achieved in a pipe at very low flow velocity, unlike the state of the art.

Another significant advantage is allowing, using the mixer of the aforementioned type, to obtain a mixing length at values as low as 300-600 mm, this advantage being particularly decisive in light of the necessary bulk reduction, knowing that such a device should be kept in a vacuum at a temperature of about 750° C.

What is claimed is:

1. A method of depositing a metal alloy coating on a substrate (7), comprising using a facility for depositing under vacuum a metal alloy coating on a substrate (7), equipped with a vapor generator-mixer comprising a vacuum chamber (6) in the form of an enclosure providing a vacuum state therein relative to an external environment and provided with an inlet and an outlet for the substrate (7), while still being substantially sealed relative to the external environment, said enclosure including a vapor deposition head providing an ejector (3), configured so as to create a jet of metal alloy vapor at sonic velocity towards a surface of the substrate (7) and perpendicular thereto, said ejector (3) being in sealed communication with a mixer (14), which is connected upstream to at least two crucibles (11,12), respectively, and comprising different metals M1 and M2 in liquid form, each crucible (11,12) being connected to the mixer (14) by respective pipes (4,4'), wherein the mixer (14) comprises a series of partitions allowing to separate at least two entering vapors, these partitions creating orifices allowing the at least two entering vapors to exit so as to be mixed in the form of alternating layers of first and second metal vapors in the direction of the exiting flow, wherein the method further comprises:

regulating a flow velocity of each of the at least two entering vapors at a mixer inlet of the mixer (14) so that said flow velocity of said at least two entering vapors at the mixer inlet of the mixer is from 5 to 50 m/s; and independently adjusting the concentration of each metal during the mixture of the first and second metal vapors to be deposited on the substrate (7).

2. The method according to claim 1, wherein the method directly deposits on the substrate (7), by a vapor jet at sonic velocity, an alloy of the first metal M1 and of the second metal M2, wherein an additional pipe (4") is mounted in bypass on the supply pipe (4') of the first metal M1 towards the mixer (14), having an isolating valve (5') and leading to an additional ejector (3') in the vacuum chamber (6), said additional ejector (3') being configured to create a vapor jet of the first metal M1 at sonic velocity towards and perpendicular to the surface of the substrate (7), the portion of the supply pipe (4') of the first metal M1 leading to the mixer (14) being provided with an additional valve (5B) intended to isolate the first crucible (12) from the mixer (14), wherein, said additional valve (5B) being closed and said isolating valve (5') being open, the first metal M1 is successively deposited at the level of the additional ejector (3') and the second metal M2 is deposited at level of the ejector (3) in the vacuum chamber (6) on the substrate (7).

3. The method according to claim 1, wherein the method directly deposits on the substrate (7), by a vapor jet at sonic velocity, an alloy of the first metal M1 and of the second metal M2, wherein an additional pipe (4") is mounted in bypass on the supply pipe (4') of the first metal M1 towards the mixer (14), having an isolating valve (5') and leading to an additional ejector (3') in the vacuum chamber (6), said additional ejector (3') being configured to create a vapor jet of the first metal M1 at sonic velocity towards and perpendicular to the surface of the substrate (7), the portion of the supply pipe (4') of the first metal M1 leading to the mixer (14) being provided with an additional valve (5B) intended to isolate the first crucible (12) from the mixer (14), wherein, said additional valve (5B) being open and said isolating valve (5') being closed, the M1+M2 alloy is directly deposited on the substrate (7) at the level of the ejector (3) in the vacuum chamber (6).

4. The method according to claim 1 wherein the method directly deposits on the substrate (7), by a vapor jet at sonic velocity, an alloy of the first metal M1 and of the second metal M2, wherein an additional pipe (4") is mounted in bypass on the supply pipe (4') of the first metal M1 towards the mixer (14), having an isolating valve (5') and leading to an additional ejector (3') in the vacuum chamber (6), said additional ejector (3') being configured to create a vapor jet of the first metal M1 at sonic velocity towards and perpendicular to the surface of the substrate (7), the portion of the supply pipe (4') of the first metal M1 leading to the mixer (14) being provided with an additional valve (5B) intended to isolate the first crucible (12) from the mixer (14), wherein, both the additional valve (5B) and the isolating valve (5') being open, the first metal M1 is successively deposited on the substrate (7) at the level of the additional ejector (3') and the M1+M2 alloy is directly deposited at the level of the ejector (3) in the vacuum chamber (6).

5. The method according to claim 1, wherein the metal or alloy deposition(s) are followed by a thermal treatment.

6. The method according to claim 1, wherein the depositing the metal alloy coating on the substrate (7) is conducted on a metal strip in continuous motion.

\* \* \* \* \*